US 6,609,560 B2

(12) United States Patent
Cho et al.

(10) Patent No.: US 6,609,560 B2
(45) Date of Patent: Aug. 26, 2003

(54) FLAT EVAPORATOR

(75) Inventors: Kyung-il Cho, Seoul (KR); In-seob Song, Kyungki-do (KR); Byeoung Ju Ha, Kyungki-do (KR); Sang-young Son, Seoul (KR); Hayong Yun, Kyungki-do (KR); Sung-gyu Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/131,477

(22) Filed: Apr. 25, 2002

(65) Prior Publication Data

US 2002/0157813 A1 Oct. 31, 2002

(30) Foreign Application Priority Data

Apr. 28, 2001 (KR) ........................................ 2001-23227
Apr. 9, 2002 (KR) ........................................ 2002-19298

(51) Int. Cl.[7] .............................................. F28D 15/00
(52) U.S. Cl. ........................... 165/104.26; 165/104.33; 361/700; 174/15.2; 257/716
(58) Field of Search ................. 165/104.33, 104.21, 165/104.26; 361/700; 257/715, 716; 174/15.2

(56) References Cited

U.S. PATENT DOCUMENTS

| | | |
|---|---|---|
| 5,441,102 A * | 8/1995 | Burward-Hoy ........ 165/104.33 |
| 5,725,049 A | 3/1998 | Swanson et al. |
| 6,167,948 B1 * | 1/2001 | Thomas ................. 165/104.26 |
| 6,328,309 B1 * | 5/2002 | Kroliczek et al. ...... 165/104.26 |

* cited by examiner

Primary Examiner—Henry Bennett
Assistant Examiner—Terrell McKinnon
(74) Attorney, Agent, or Firm—Burns, Doane, Swecker & Mathis, L.L.P.

(57) ABSTRACT

A flat evaporator is provided. In the evaporator, a common chamber formed on a substrate with a predetermined diameter and depth for containing a coolant is divided into a vaporization cavity region, a capillary region surrounding the vaporization cavity region, and a manifold region surrounding the capillary region. The capillary region has a capillarity generator capable of generating capillary action, and a top plate is configured to include an exhaust unit including a gas collector to exhaust a gas coolant generated in the vaporization cavity region. The evaporator can be implemented as a small and thin cooling device for performing cooling without external power. Furthermore, the evaporator can effectively prevent degradation of fluid flow force due to coexistence of gas and liquid by isolating a liquid coolant from a vaporized coolant by a capillary region, thereby significantly improving heat exchange characteristics.

44 Claims, 8 Drawing Sheets

FIGI. 7
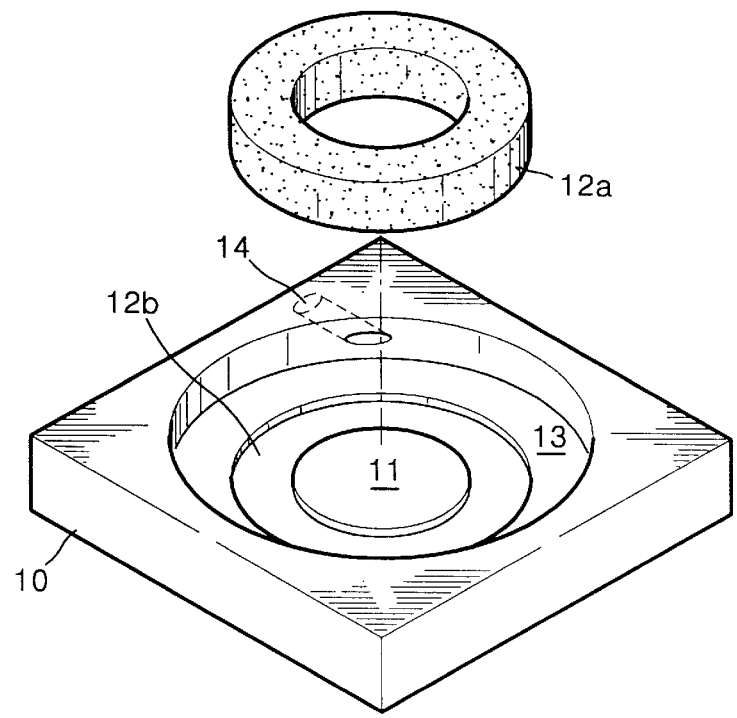
FIGI. 8
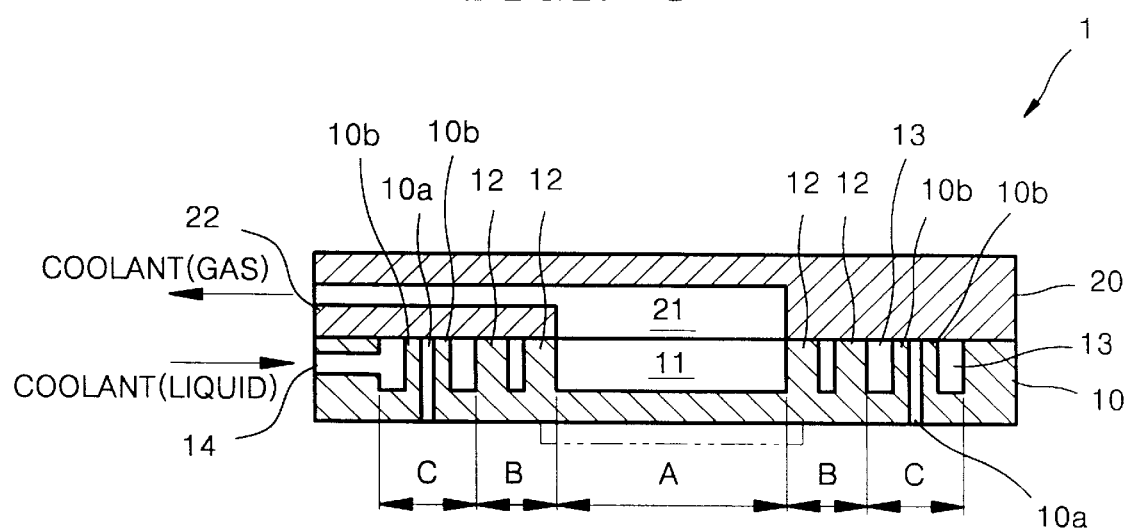

FLAT EVAPORATOR

Priority is claimed to Patent Application Numbers 2001-23227 filed in Rep. of Korea on Apr. 28, 2001 and 2002-19298 filed on Apr. 9, 2002, herein incorporated by reference.

BACKGROUND OF THE INVENTION

1. Field of the Invention

The present invention relates to an evaporator having a structure for circulating working fluids by capillary action, and more particularly, to a flat evaporator having a capillarity generator that surrounds a vaporization cavity region.

2. Description of the Related Art

As electronic technologies have advanced, electronic devices tend to be designed as modules and have smaller dimensions and higher output capabilities. Heat generated per unit area of electronic devices continues to increase accordingly. Thus, it is of great concern to properly control heat generated in electronic devices in designing and operating the electronic devices. There are several well-known techniques for controlling temperature in electronic devices including: thermal conduction, natural convection/radiation or forced convection of air, cooling by a liquid, immersion, distribution of heat through heat pipes.

A capillary pumped loop (CPL), which has recently been developed, is a system in which surface tension at boundaries where phase change of a coolant occurs is used as a driving source for transporting the coolant. A cooling system employing this CPL includes an evaporator for transferring heat from a heat source using a gas coolant and a condenser for condensing the gas coolant output from the evaporator into a liquid.

CPL evaporators must be constructed such that heat generated from a heat source effectively promotes phase change of a coolant and that boundaries where phase change of the coolant occurs are evenly distributed around a heat source since surface tension at the boundaries is a driving source for transporting the coolant.

A cooling system devised by Stenger of NASA Lewis Center is constructed by a loop in which a coolant flows through a pipe. The loop consists of an evaporator portion having a porous body that generates capillary action on a path along which the coolant flows at one end of the pipe. The loop is configured to condense the coolant by giving up heat at the other end of the pipe. Since it is difficult to make the pipe loop smaller, this structure is not suitable for electronic instruments or equipment of smaller dimensions.

U.S. Pat. No. 5,725,049 by Swanson et al., describes a flat heat exchanger employing a CPL. The heat exchanger proposed in the above patent includes an evaporator, a condenser, a liquid tube, and a vapor tube. The evaporator has top and bottom bodies, and a porous body between the top and bottom bodies thereof. Grooves connected to the liquid tube are formed in a top portion of the porous structure, and grooves connected to the vapor tube are formed in a bottom portion thereof. The heat exchanger is configured so that a liquid coolant supplied from a central portion of the top grooves of the porous structure disperses into adjacent grooves to vaporize the liquid coolant through the porous structure thereby outputting vapor to the vapor tube through the bottom grooves thereof. However, because of its structure, the heat exchanger cannot be used as a cooling device for a heat source having a small surface area but high heat generation or a small thin cooling device.

SUMMARY OF THE INVENTION

To solve the above problems, it is an object of the present invention to provide a flat evaporator having small and thin dimensions.

It is another object of the present invention to provide a flat evaporator having small dimensions and high cooling efficiency.

Accordingly, to achieve the above objects, the present invention provides a flat evaporator including: a substrate having on the top surface a vaporization cavity region with a central chamber in which main evaporation of a liquid coolant occurs, a capillary region surrounding the central chamber, and a manifold region surrounding the capillary region; a top plate disposed on the substrate; a capillarity generator which is formed in the capillary region and flows the coolant from the manifold region into the vaporization cavity region by capillary action; an exhaust unit which includes a gas collector and exhausts a gas coolant generated in the vaporization cavity region; and a supplying unit including a coolant supply portion to supply the liquid coolant from the outside to the manifold region.

The present invention also provides a flat evaporator comprising: a substrate having on the top surface a vaporization cavity region with a central chamber in which main evaporation of a liquid coolant occurs, a capillary region surrounding the central chamber, and a manifold region surrounding the capillary region; a top plate disposed on the substrate; a capillarity generator which is formed in the capillary region and flows the liquid coolant from the manifold region into the vaporization cavity region by capillary action; an exhaust unit which includes a gas collector and exhausts a gas coolant generated in the vaporization cavity region; a plurality of adiabatic regions which divide a liquid coolant path in the manifold region into a plurality of flow paths and prevent heat from being transferred to the liquid coolant flowing along the plurality of flow paths; and a supplying unit including a coolant supply portion to supply the liquid coolant from the outside to the manifold region.

In one alternative embodiment of the present invention, the capillarity generator may be implemented with a porous body having a plurality of cavities and capable of generating capillary action. In another alternative embodiment, the capillarity generator may be implemented with a wick structure for providing a coolant flow gap between the vaporization cavity region and the manifold region.

In a flat evaporator according to the present invention, it is preferable that the gas collector is formed of a size large enough to cover only the vaporization cavity region or both of the vaporization cavity region and the capillary region. It is preferable that a coolant inlet passage extends from one side of the substrate or the top plate to the manifold region, and a coolant output passage extends from one side of the top plate to the gas collector.

In a flat evaporator according to the present invention, it is preferable that a groove is formed at the bottom of the top plate corresponding to only the manifold region or both of the manifold region and the capillary region, thereby increasing the entire volume of the manifold region. It is preferable that a first auxiliary capillary generator is formed at the bottom of the central chamber, and the first auxiliary capillary generator is formed of a porous body and/or a wick structure. More preferably, a second auxiliary capillary generator is formed at the bottom of the manifold region, and the second auxiliary capillary generator is formed of a porous body and/or a wick structure.

To evenly supply a coolant into the vaporization cavity region to induce uniform evaporation over the vaporization cavity region, it is preferable that the capillary region is formed to asymmetrically surround the vaporization cavity region, and the width of the capillary region is larger towards the coolant supply portion. Preferably, the width of the manifold region surrounding the capillary region is larger farther away from the coolant supply portion. In an alternative embodiment, two coolant supply portions can be symmetrically disposed at opposite sides of the center chamber so that the liquid coolant is supplied through the two coolant supply portions into the manifold region.

BRIEF DESCRIPTION OF THE DRAWINGS

The above objects and advantages of the present invention will become more apparent by describing in detail preferred embodiments thereof with reference to the attached drawings in which:

FIG. 7 is an exploded perspective view of a substrate of the evaporator shown in FIGS. 5 and 6 according to the present invention and a porous body being mounted into the substrate;

FIG. 8 is a cross-sectional view of an evaporator according to a fourth embodiment of the present invention;

DETAILED DESCRIPTION OF THE INVENTION

Figure 1:
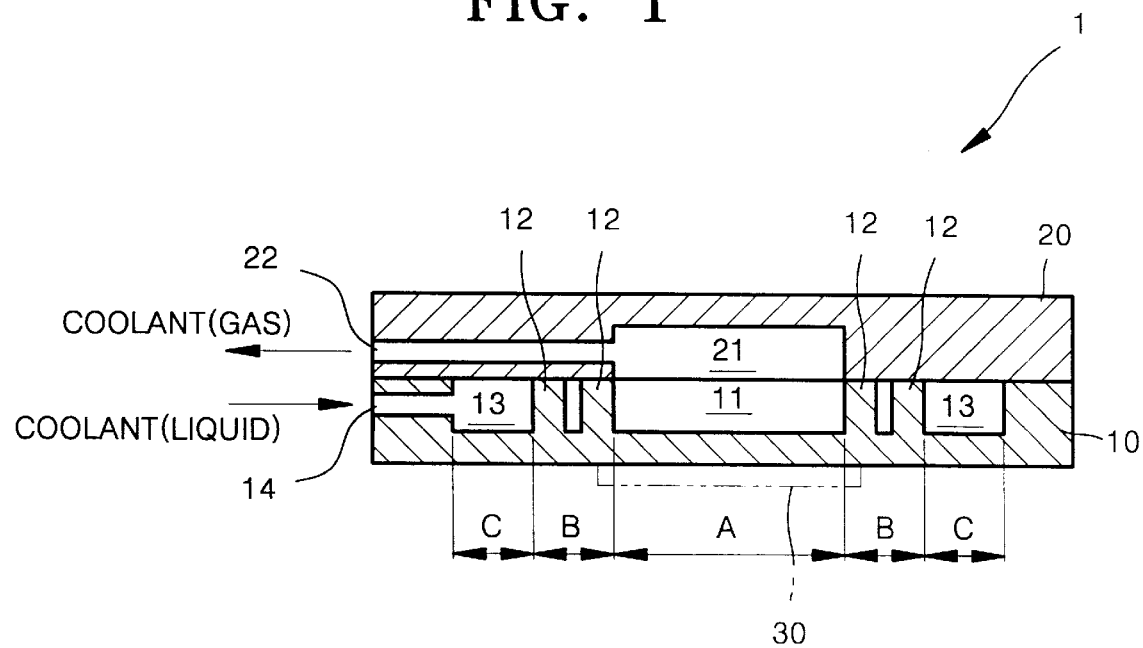
FIG. 1 is a cross-sectional view of an evaporator according to a first embodiment of the present invention.
Figure 2:
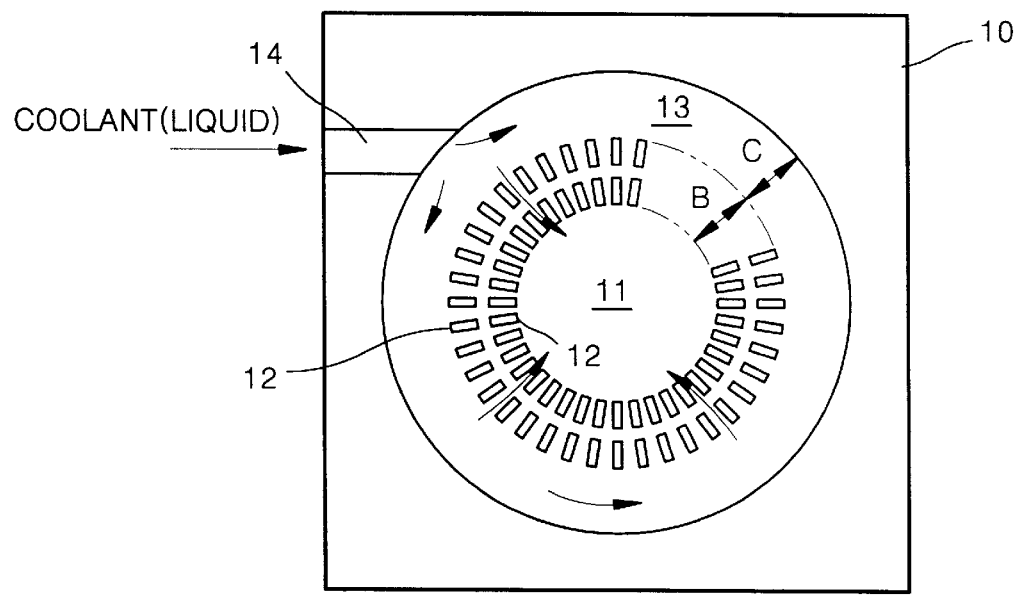
FIG. 2 is a top view of a substrate applied to the evaporator of FIG. 1.

Referring to FIGS. 1 and 2, an evaporator 1 includes a substrate 10 and a top plate 20 stacked on the substrate 10. A common chamber is formed on the substrate 10 to a predetermined depth. The common chamber is divided into three regions: a vaporization cavity region A having a central chamber 11 in which main evaporation of a coolant occurs, an annular capillary region B surrounding the central chamber 11, and an annular manifold region C surrounding the capillary region B.

The vaporization cavity region A receives a coolant introduced through the capillary region B to vaporize the coolant by heat supplied from a heat source 30 on the bottom of the substrate 10. The capillary region B surrounding the vaporization cavity region A has a capillarity generator to draw in the coolant. The evaporator 1 according to the first embodiment of the present invention shown in FIGS. 1 and 2 is constructed so that a plurality of wick structures 12 capable of providing capillary action like capillaries, each having a rectangular cross-section, are arranged in two rows in a radial direction from the vaporization cavity region A. The plurality of wick structures 12 provide a coolant flow gap between the manifold region and the vaporization cavity region. The top of each wick 12 is in contact with the bottom of the top plate 20. Here, the wick 12 may alternatively have a cross-section of a different shape, other than rectangle, capable of generating capillary action.

The manifold region C surrounding the capillary region B serves as a path along which a liquid coolant flows for evenly supplying the coolant to the capillary region B. The manifold region C is connected to a coolant inlet passage 14 formed on one side of the substrate 10.

Figure 3:
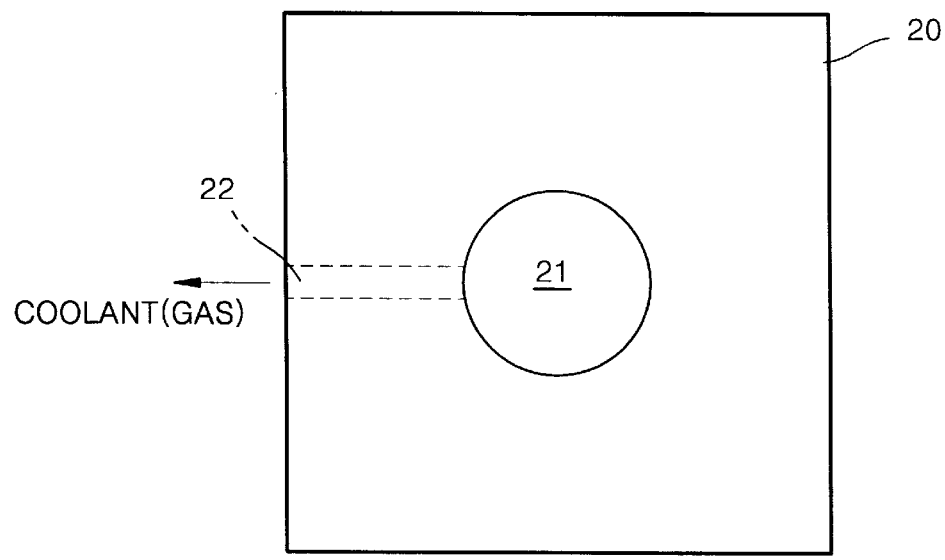
FIG. 3 is a bottom view of a top plate applied to the evaporator of FIG. 1.

Referring to FIG. 3, a gas collector 21 corresponding to the central chamber 11 of the vaporization cavity region A is provided within the top plate 20 fixed onto the substrate 10. The gas collector 21 is connected to a coolant outlet passage 22 for outputting a gas coolant from the gas collector 21.

In the evaporator 1 according to the present invention having the construction described above, a coolant is supplied to the vaporization cavity region A situated at the center of the substrate 10 from the neighborhood thereof. That is, the coolant flows parallel to the plane of the substrate 10 and collects in the central chamber 11 of the substrate 10. The capillary region B for drawing in the coolant by capillary action surrounds the vaporization cavity region A. The manifold region C surrounds the capillary region B so as to evenly supply the coolant to the entire capillary region B.

A flow force of the coolant is generated at a portion where phase change of the coolant occurs, in particular, at the inner end of the capillary region B being in contact with the central chamber 11. In the above construction, the top of the manifold region C is sealed by the bottom of the top plate 20 so that the coolant entering the manifold region C flows only into the capillary region B.

In the first embodiment described above, the capillary region B is sealed by the bottom of the top plate 20. However, a portion of the top of the capillary region B may be open since the liquid coolant is vaporized in the capillary region B.

Figure 4:
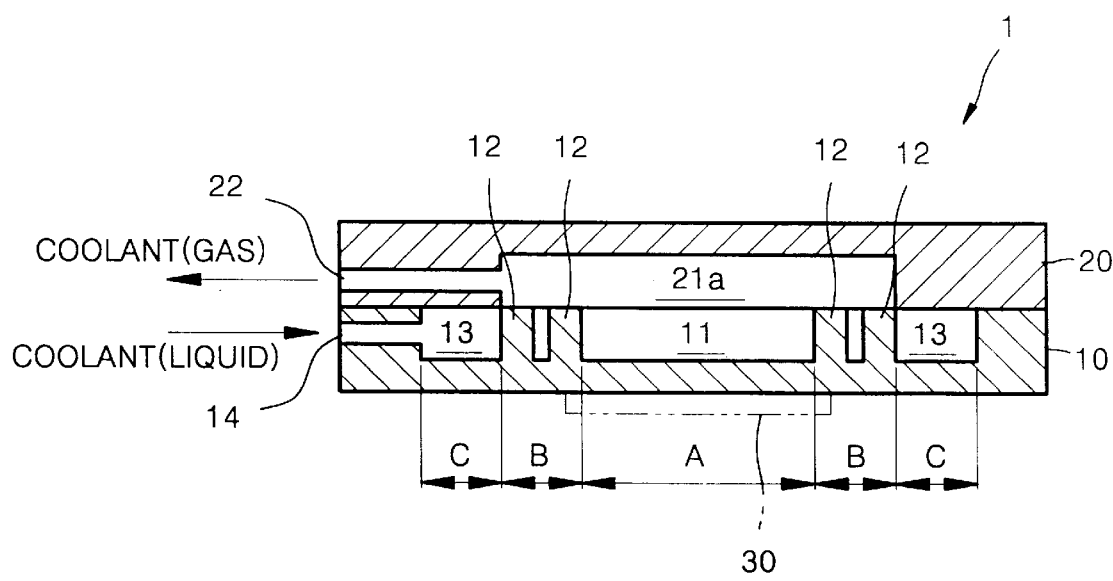
FIG. 4 is a cross-sectional view of an evaporator according to a second embodiment of the present invention.

FIG. 4 shows an evaporator according to a second embodiment of the present invention constructed such that a gas collector 21a of the top plate 20 is formed to include the vaporization cavity region A and the capillary region B so that the top portions of a central chamber 11 and the plurality of wick structures 12 open. Alternatively, the gas collector 21a may be formed to include the vaporization cavity region A and only a portion of the inside capillary region B.

In the above construction, the vaporization cavity region A preferably has an area corresponding to the size (area) of a heat source 30. Alternatively, a region including the vaporization cavity region A and the capillary region B may have an area corresponding to the size of the heat source 30 depending on the type of application.

Figure 5:
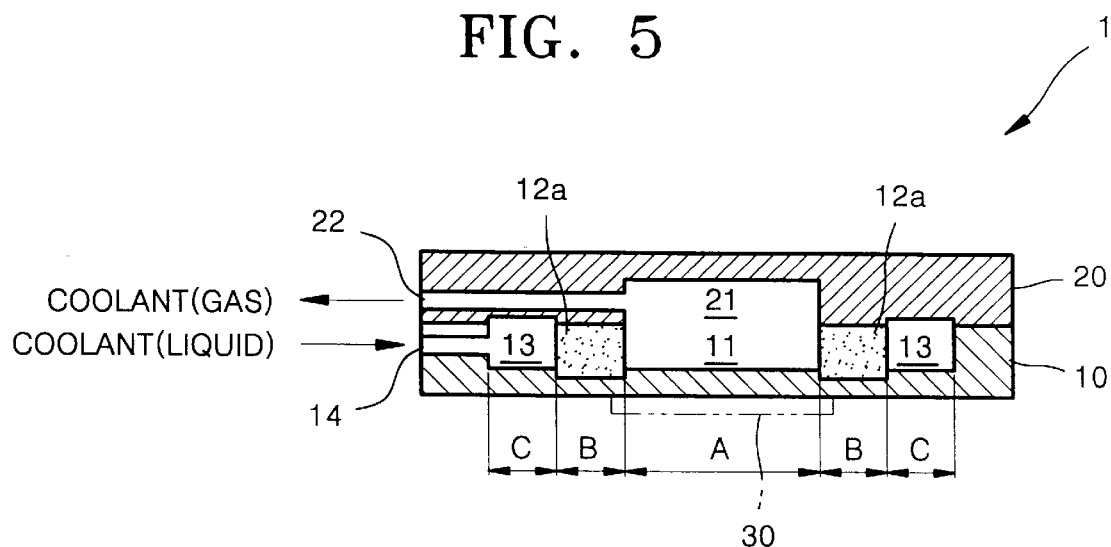
FIG. 5 is a cross-section view of an evaporator according to a third embodiment of the present invention.
Figure 6:
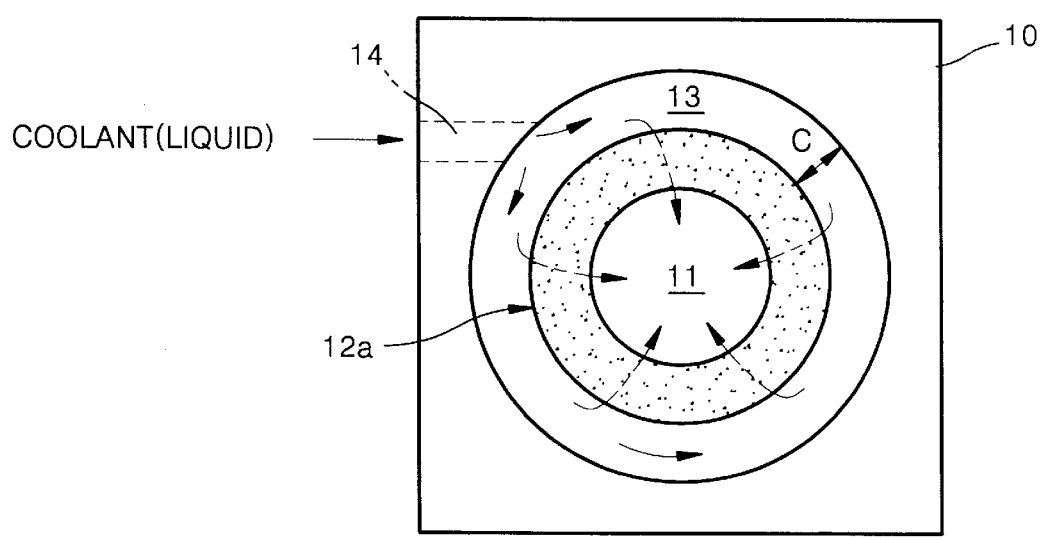
FIG. 6 is a top view of a substrate applied to the evaporator of FIG. 5.

FIG. 5 is a cross-sectional view of an evaporator according to a third embodiment of the present invention, FIG. 6 is a top view of a porous body mounted into a substrate of the evaporator of FIG. 5, and FIG. 7 is an exploded perspective view of the porous body being mounted into the substrate of the evaporator according the third embodiment of the present invention.

In the third embodiment of the present invention, a capillarity generator is implemented by a porous body having a plurality of cavities to induce capillary action. The capillary generator formed of this porous body can be applied to the structures of first and second embodiments described above and a forth embodiment of the present invention to be described later.

Referring to FIGS. 5 through 7, an annular porous body 12a is formed in the capillary region B to surround the vaporization cavity region A, i.e., the central chamber 11. The porous body 12a has so many cavities that it can allow a sufficient amount of coolant to pass. Alternatively, the capillary region B of the substrate 11 may have a recession 12b 11 at its surface such that the annular porous body 12a is stably positioned in the recession 12b.

Figure 9:
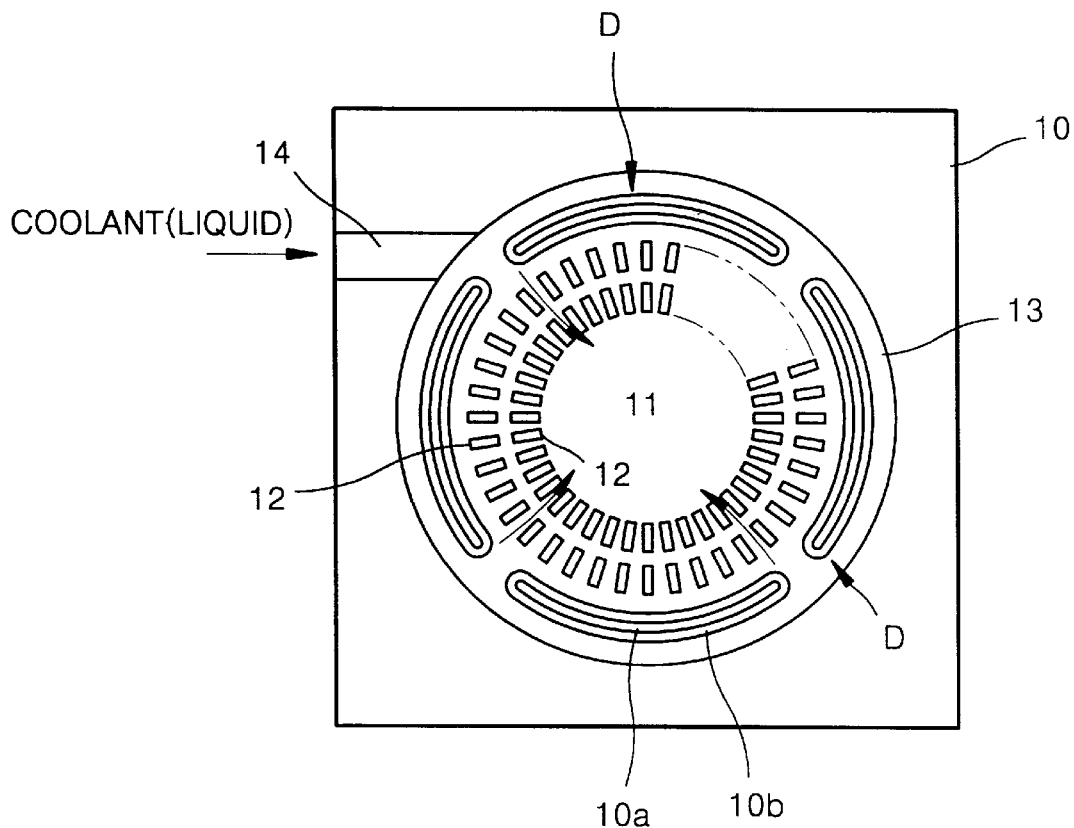
FIG. 9 is a top view of a substrate applied to the evaporator of FIG. 8.

FIG. 8 is a cross-sectional view of a flat evaporator according to a fourth embodiment of the present invention, and FIG. 9 is a plan view of a substrate 10 applied to the evaporator 1 of FIG. 1. Although the fourth embodiment is described as that the capillarity generator is implemented with the plurality of wick structures 12 described above, it is appreciated that the plurality of wick structures 12 can be replaced by the porous body 12a, with a slight structural modification if necessary. Such modification can be easily implemented, so descriptions of possible modifications will not be provided here. The scope of the present invention is not limited by changes in design required to mount the porous body 12a.

Referring to FIGS. 8 and 9, the evaporator 1 includes a substrate 10 and a top plate 20 stacked on the substrate 10. A common chamber is formed on the substrate 10 to a predetermined depth. The common chamber is divided into three regions: a vaporization cavity region A having a central chamber 11 in which main evaporation of a coolant occurs, an annular capillary region B surrounding the central chamber 11, and an annular manifold region C surrounding the capillary region B.

The vaporization cavity region A receives a coolant introduced through the capillary region B to vaporize the coolant by heat supplied from a heat source 30 on the bottom of the substrate 10. The capillary region B surrounding the vaporization cavity region A has a plurality of wick structures 12 densely arranged for drawing in the coolant. The evaporator 1 according to the third embodiment of the present invention shown in FIGS. 5 and 6 is constructed so that the plurality of wick structure 12, each having a rectangular cross-section, are arranged in two rows in a radial direction from the vaporization cavity region A. The top of each wick structure 12 is in contact with the bottom of the top plate 20. Here, the wick structure 12 may alternatively have a cross-section of a different shape, other than rectangle, capable of generating capillary action.

The manifold region C surrounding the capillary region B has manifolds 13 in which the coolant flows. That is, the manifold region serves as a path, along which the coolant flows, for evenly supplying the coolant to the capillary region B. The manifold region C is connected to a coolant inlet passage 14 formed on one side of the substrate 10. Also, the manifold region C has a plurality of adiabatic regions D surrounding the capillary region B for separating the inside of a coolant flow path in the manifold region C from the outside thereof. The adiabatic regions D are provided to prevent heat from the center of the substrate 10 from being transferred to the coolant flowing in the manifold region C.

In order to effectively prevent heat transfer, each of the adiabatic regions D has an elongated through hole 10a formed at the bottom of the manifold region C along the manifold region C and a wall 10b encircling the through hole 10a. A top end of the wall 10b is in contact with the bottom of the top plate 20, thereby preventing leakage of the coolant. Air is introduced into each of the through holes 10a to provide a thermal insulating layer of the air within the through hole 10a.

The adiabatic region D having the thermal insulating air layer prevents heat from the center of the substrate 10 from being transferred to the manifold region C, thereby preventing evaporation of the coolant by heating in the manifold region C so that the coolant is introduced in a liquid phase into the capillary region B. This prevents the coolant from drying out in the manifold region C. Furthermore, the manifold region C has multiple coolant flow paths, which allows for even temperature distribution of the capillary region B along the circumference thereof.

A gas collector 21 corresponding to the central chamber 11 of the vaporization cavity region A is provided within the top plate 20 fixed onto the substrate 10. The gas collector 21 is connected to a coolant outlet passage 22 for exhausting a gas coolant in the gas collector 21. Here, the gas collector 21 may have an area sufficiently large to include the top portion of the capillary region B as well.

In the evaporator 1 according to the present invention having the construction described above, a coolant is supplied to the vaporization cavity region A situated at the center of the substrate 10 from the neighborhood thereof. That is, the coolant flows parallel to the plane of the substrate 10 and collects in the central chamber 11 of the substrate 10. The capillary region B for drawing in the coolant surrounds the vaporization cavity region A. The manifold region C surrounds the capillary region B so as to evenly distribute the coolant to the entire capillary region B. Also, the manifold region C is provided with the adiabatic region D.

A flow force of the coolant is generated at a portion where phase change of the coolant occurs, in particular, at the inner end of the capillary region B being in contact with the central chamber 11. In the above construction, the top of the manifold region C is sealed by the bottom of the top plate 20 so that the coolant entering the manifold region C flows only into the capillary region B.

Figure 10:
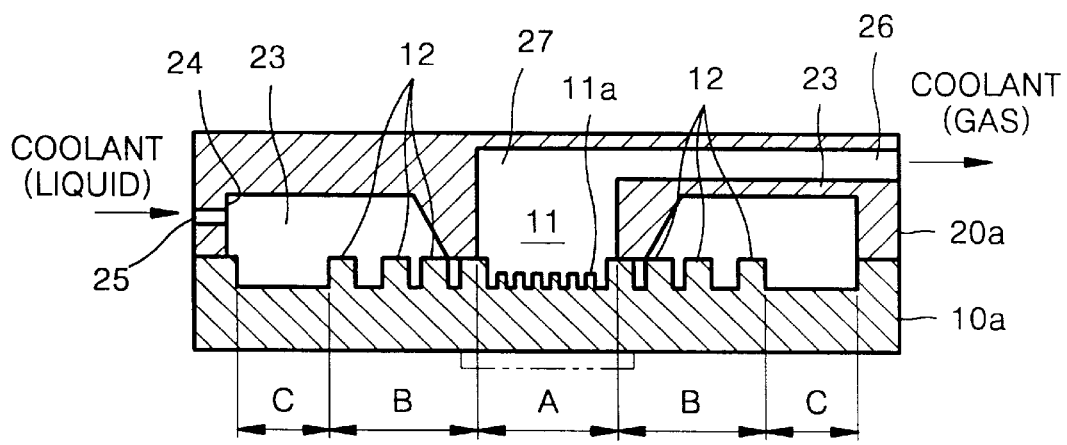
FIG. 10 is a cross-sectional view of an evaporator according to a fifth embodiment of the present invention.

FIG. 10 shows an evaporator according to a fifth embodiment of the present invention having a structure in which an annular groove 23 corresponding to the capillary region B and the manifold region C is formed at the bottom of a top plate 20a, thereby increasing the volume of the capillary region B and the manifold region C. Furthermore, this embodiment exemplifies the structure in which the coolant is introduced and exhausted through the top plate 20a. This structure does not restrict the technical scope of this invention, and the structure for introducing/exhausting a coolant in the embodiments described above may be applied to this embodiment.

In the evaporator according to this embodiment, a coolant inlet port 24 connected to the manifold region C of a substrate 10a is disposed at one location on the top plate 20a, and a coolant outlet port 27 is disposed at the central portion of the top plate 20a. A coolant inlet passage 25 and a coolant outlet passage 26 for directing entry and exit of the coolant are provided at the top portions of the coolant inlet port 24 and the coolant outlet port 27, respectively. The coolant input passage 25 and the coolant outlet passage 26 may be formed in the top plate 20a.

The annular groove 23 is formed at the bottom of the top plate 20a to a depth, ranging from the bottom of the top plate 20a to a portion near the top thereof. Thus, the manifold region C and the capillary region B have volumes sufficiently large to accommodate a great amount of coolant in the manifold region C, thereby preventing or delaying dry out due to a small amount of coolant. That is, the increased volume of the manifold region C and the capillary region B effectively prevents or delays liquefaction of a vaporized coolant. Furthermore, the coolant can effectively be pushed out into the vaporization cavity region A by the pressure of the sufficiently supplied coolant.

A plurality of first auxiliary wick structures 11a are arranged densely at the bottom of the vaporization cavity region A of the substrate 10a, i.e., at the central chamber 11. The plurality of first auxiliary wick structure 11a generate capillary action, causing the coolant to be drawn from the capillary region B to the central portion of the central chamber 11. Also, the plurality of first auxiliary wick structures 11a increase an area in which heat is transferred to the coolant to promote effective evaporation of the coolant. Furthermore, the first auxiliary wick structures 11a draw in and supply a sufficient amount of coolant to the central chamber 11, thereby preventing dry out due to shortage of the coolant. The first auxiliary wick structures 11a as well as the wick structures 12 of the capillary region B provide a coolant flow force to effectively circulate the coolant.

Figure 11:
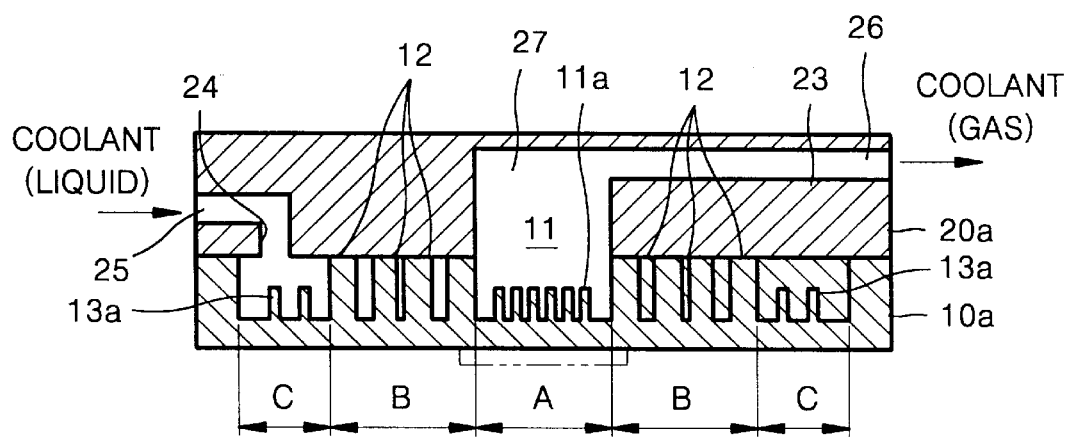
FIG. 11 is a cross-sectional view of an evaporator according to a sixth embodiment of the present invention.
Figure 12:
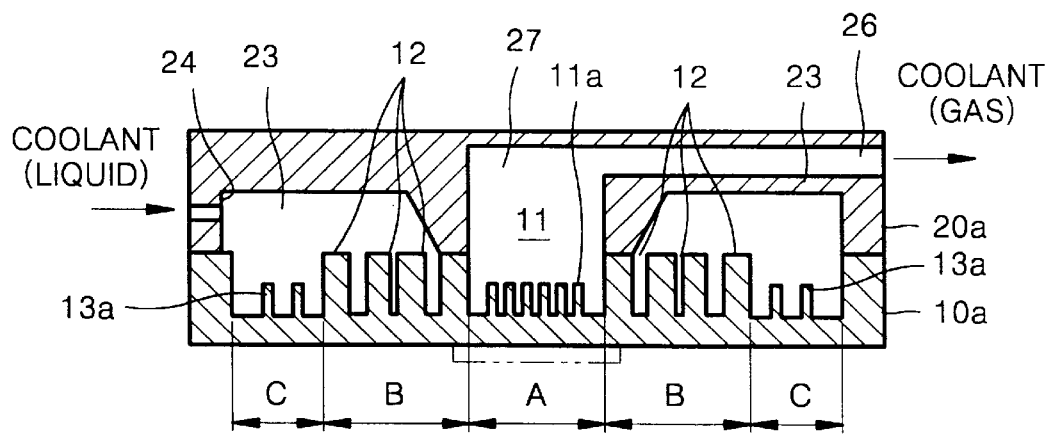
FIG. 12 is a top view of a substrate applied to an evaporator according to a seventh embodiment of the present invention.

Referring to FIGS. 11 and 12, which show evaporators according to fifth and sixth embodiments of the present invention, respectively, a plurality of first and second auxiliary wick structures 11a and 13a are arranged densely at the bottom portions of the central chamber 11 and the manifold region C, respectively. In this case, the first and second auxiliary wick structures 11a and 13a are lower than the wick structures 12 of the capillary region B. The difference in heights does not restrict the technical scope of the present invention. Furthermore, the bottom of the manifold region C is formed lower than that of the capillary region B. In these embodiments shown in FIGS. 11 and 12, the height of the second auxiliary wick structures 13a may be greater than or equal to that of the wick structures 12 of the capillary region B.

The plurality of second auxiliary wick structures 13a generate capillary action, causing the coolant to promptly be drawn from the manifold region C and the capillary region B to the central portion of the central chamber 11. Also, the plurality of second auxiliary wick structures 13a increase an area in which heat is transferred to the coolant, thereby promoting effective evaporation of the coolant. Furthermore, the second auxiliary wick structures 13a draw in and supply a sufficient amount of coolant to the central chamber 11, thereby preventing dry out due to shortage of the coolant. The second auxiliary wick structures 13a as well as the wick structures 12 of the capillary region B provide a coolant flow force to effectively circulate the coolant.

The evaporator according to the sixth embodiment of the present invention having the structure shown in FIG. 11 is most preferred since it has all the advantages of those shown in FIGS. 10 and 12.

Figure 13:
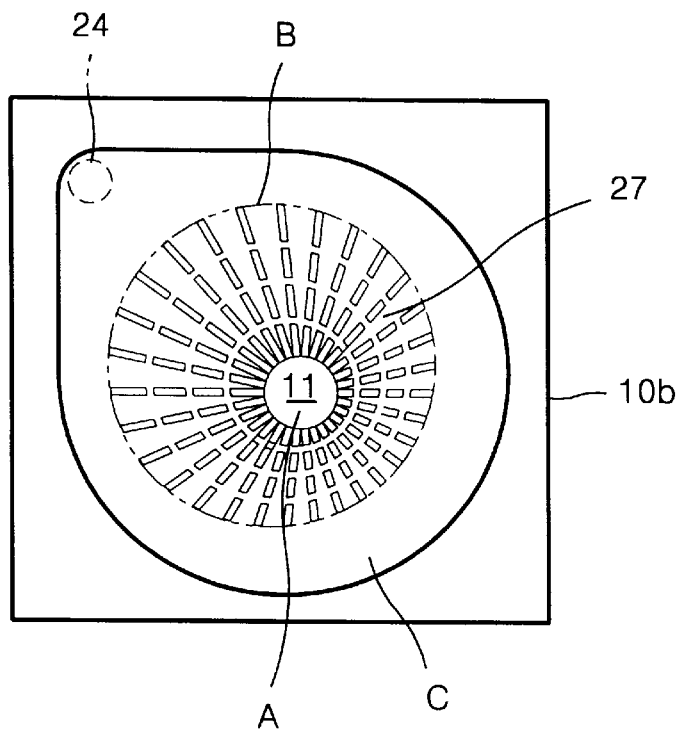
FIG. 13 is a top view of a substrate applied to an evaporator according to an eighth embodiment of the present invention.

FIG. 13 is a top view of a substrate 10b having a capillary region B of an asymmetrical structure in an evaporator according to an eighth embodiment of the present invention. Referring to FIG. 13, a vaporization cavity region A having a central chamber 11 is located away from the center of the substrate 10b. Thus, the coolant outlet port 27 formed in the top plate 20a as shown in FIGS. 10–12 should be disposed at a position corresponding to the vaporization cavity region A displaced from the center of the substrate 10b. The capillary region B encircling the vaporization cavity region A is located substantially at the center of the substrate 10b. Accordingly, the capillary region B asymmetrically surrounds the vaporization cavity region A. A manifold region C is located substantially at the center of the substrate 10b, and one side thereof extends toward the coolant inlet port 24 formed in the top plate 20a. The capillary region B becomes narrower as it becomes farther from the coolant inlet port 24, and a portion of the capillary region B that is nearest to the coolant inlet port 24 is wider than any other portion thereof. Here, the width of the capillary region B refers to a distance from an outer circumference of the capillary region B to an inner circumference encircling the vaporization cavity region A, i.e., a distance by which the coolant flowing from the manifold region C to the vaporization cavity region A migrates through the capillary region B. The manifold region C becomes wider as it becomes farther from the coolant inlet port 24.

In the above construction, the coolant introduced from the coolant inlet port 24 of the top plate 20a corresponding to one side of the substrate 10b flows through the manifold region C which widens as it becomes farther from the coolant inlet port 24. The coolant flowing in the manifold region C is supplied to the vaporization cavity region A through the capillary region B. In this case, since the manifold region C becomes wider as it becomes farther from the coolant inlet port 24, the coolant effectively flows to a portion that is most distant from the coolant inlet port 24. When the coolant flowing the manifold region C is in contact with the capillary region B, the coolant flows into the vaporization cavity region A by capillary action generated by wick structures of the capillary region B. Since the capillary region B becomes wider as it is nearer to the coolant inlet port 24, the coolant is evenly distributed throughout the capillary region B by a difference in friction between each portion of the capillary region B. That is, if the capillary region has a symmetrical structure as in the embodiments described above, the coolant suffers from higher friction at a portion of the manifold region C that is farther from the coolant inlet port 24. Thus, a sufficient amount of coolant cannot be supplied to the most distant portion thereof, thereby causing a dry out of the coolant at that portion. However, in this embodiment, a frictional force is adjusted for each portion of the capillary region B and the manifold region C due to their asymmetrical structure, thereby enabling the coolant to be evenly supplied to the vaporization cavity region A from every direction.

Figure 14:
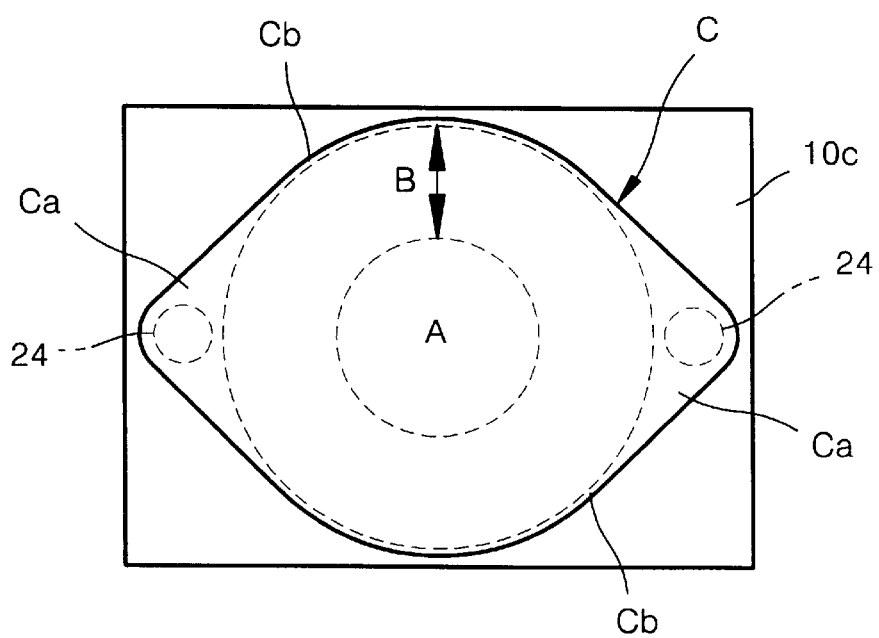
FIG. 14 is a top view of a substrate applied to an evaporator according to a ninth embodiment of the present invention.

FIG. 14 shows an evaporator according to a ninth embodiment of the present invention having two coolant inlet ports 24 which are disposed at opposite sides of the capillary region B for supplying a coolant to the entire capillary region B. More specifically, FIG. 14 is a top view of a substrate 10c having a vaporization cavity region A, a capillary region B surrounding the vaporization cavity region A, and a manifold region C disposed on the outside of the capillary region B.

Referring to FIG. 14, the vaporization cavity region A is provided at the central portion of the substrate 10a, and the capillary region B is provided symmetrically around the vaporization cavity region A. The manifold region C surrounding the capillary region B has a substantially elliptical shape. Thus, the manifold region C has two wide regions Ca, one at each side in a major-axis direction, and two narrow regions Cb, one at each side in a minor-axis direction. A top plate (not shown) must have the two coolant inlet ports 24 corresponding to the two wide regions Ca of the manifold region C. The structure of each coolant inlet port 24 formed in the top plate will be omitted since it can be easily derived from the embodiments described above.

In the evaporator according to the ninth embodiment of the present invention shown in FIG. 14, the coolant is supplied directly from both sides of the capillary region B, thereby enabling even supply of the coolant and even temperature distribution over the entire capillary region B. The structure for supplying the coolant from both sides of the capillary region B is distinguished from the structure for supplying it from one side thereof in other embodiments described above. This two-way coolant supply can effectively prevent or delay dry out caused by a partial shortage of the coolant.

Figure 15:
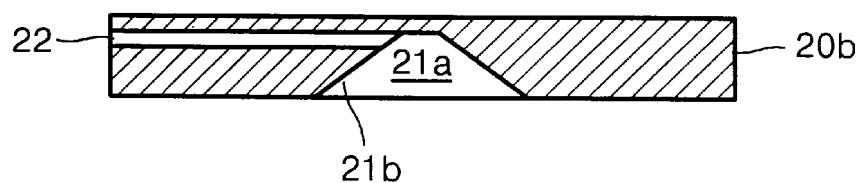
FIG. 15 is a cross-sectional view of a top plate for an evaporator according to a tenth embodiment of the present invention.
Figure 16:
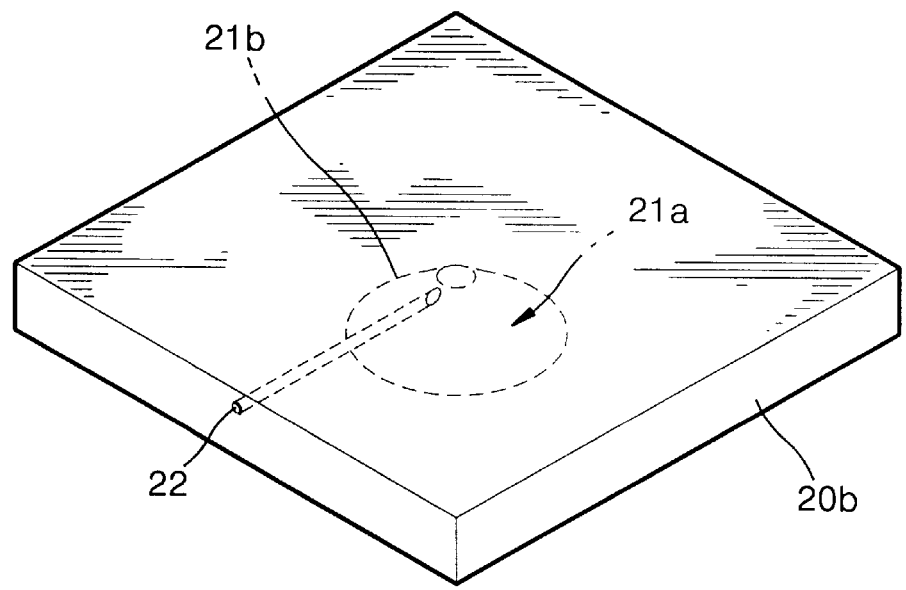
FIG. 16 is a perspective view of the top plate shown in FIG. 15.

FIGS. 15 and 16 are cross-sectional and perspective views, respectively, a top plate for an evaporator according to a tenth embodiment of the present invention where the top plate 20b having a gas collector 21a formed as a conical groove 21b is shown.

The gas collector 21 is formed by the conical groove 21b to effectively collect gas from the central chamber 11 of the substrate 10 and exhaust the collected gas through a coolant outlet passage 22. Due to the slopping sidewall of the groove 21b which makes a coolant path narrow, a large amount of the coolant that is not completely vaporized in the central chamber 11 is collected by the gas collector 21a and sent back to the central chamber 11.

Figure 17:
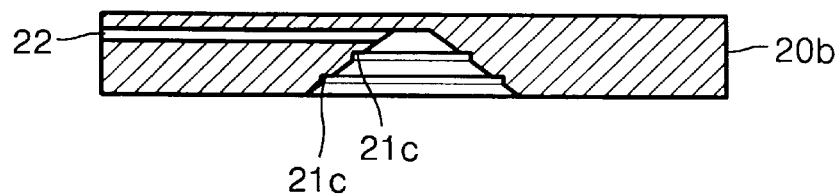
FIG. 17 is a cross-sectional view of a top plate for an evaporator according to an eleventh embodiment of the present invention.

FIG. 17 is a cross-sectional view of a top plate for an evaporator according to an eleventh embodiment of the present invention where the top plate 20b having stepped edges 21a on the sloping sidewall of the conical groove 21b. As shown in FIG. 17, two upper and lower stepped edges 21c are formed on the sloping sidewall of the groove 21b, resulting in closed circles.

When a coolant that is not completely vaporized enters the gas collector 21a of FIG. 17, the non-vaporized coolant returns to the central chamber 11 since the coolant path is narrowed by the slopping sidewall of the groove 21b. In addition, the stepped edges 21c formed on the slipping sidewall of the groove 21b reduce gas-to-liquid interfacial tension of the coolant to be less thermally resistive, thereby improving evaporation efficiency.

The present invention can provide for a small and thin cooling device for performing cooling without external power. Furthermore, the present invention can effectively prevent the degradation of fluid flow force due to coexistence of gas and liquid by isolating a liquid coolant from a vaporized coolant by a capillary region, thereby significantly improving heat exchange characteristics.

An evaporator according to the present invention is suitable for cooling devices for small-sized parts of an electronic device such as a computer CPU as described above. In particular, an evaporator can adhere to a CPU itself which is a heat source for an electronic device having a small usable volume such as a notebook computer, thereby preventing an increase in the size and weight of a notebook computer due to a separate cooling device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A flat evaporator comprising:

a substrate having on the top surface a vaporization cavity region with a central chamber in which main evaporation of a liquid coolant occurs, a capillary region surrounding the central chamber, and a manifold region surrounding the capillary region;

a top plate disposed on the substrate;

a capillarity generator which is formed in the capillary region and flows the liquid coolant from the manifold region into the vaporization cavity region by capillary action;

an exhaust unit which includes a gas collector and exhausts a gas coolant generated in the vaporization cavity region;

a plurality of adiabatic regions which divide a liquid coolant path in the manifold region into a plurality of flow paths and prevent heat from being transferred to the liquid coolant flowing along the plurality of flow paths; and a supplying unit including a coolant supply portion to supply the liquid coolant from the outside to the manifold region.

2. The flat evaporator of claim 1, wherein each of the plurality of adiabatic regions has a wall and formed in the manifold region to surround the capillary region.

3. The flat evaporator of claim 1, wherein each of the plurality of adiabatic region has a through hole at the bottom thereof for introducing air, and the wall is formed to surround the through hole.

4. The flat evaporator of claim 2, wherein each of the plurality of adiabatic region has a through hole at the bottom thereof for introducing air, and the wall is formed to surround the through hole.

5. A flat evaporator comprising:

a substrate having on the top surface a vaporization cavity region with a central chamber in which main evaporation of a liquid coolant occurs, a capillary region surrounding the central chamber, and a manifold region surrounding the capillary region;

a top plate disposed on the substrate;

a capillarity generator which is formed in the capillary region and flows the coolant from the manifold region into the vaporization cavity region by capillary action;

an exhaust unit which includes a gas collector and exhausts a gas coolant generated in the vaporization cavity region; and a supplying unit including a coolant supply portion to supply the liquid coolant from the outside to the manifold region.

6. The flat evaporator of claim 5, wherein the capillarity generator is formed of a porous body having a plurality of cavities and capable of generating capillary action.

7. The flat evaporator of claim 5, wherein the capillarity generator is formed of a wick structure which provides a coolant flow gap between the manifold region and the vaporization cavity region.

8. The flat evaporator of claim 5, wherein the gas collector is formed of a size large enough to cover only the vaporization cavity region or both of the vaporization cavity region and the capillary region.

9. The flat evaporator of claim 5, wherein a coolant inlet passage extends from one side of the substrate or the top late to the manifold region, and a coolant output passage extends from one side of the top late to the gas collector.

10. The flat evaporator of claim 5, wherein a groove is formed at the bottom of the top plate corresponding to only the manifold region or both of the manifold region and the capillary region, thereby increasing the entire volume of the manifold region.

11. The flat evaporator of claim 5, wherein a first auxiliary capillary generator is formed at the bottom of the central chamber, and the first auxiliary capillary generator is formed of a porous body and/or a wick structure.

12. The flat evaporator of claim 8, wherein a first auxiliary capillary generator is formed at the bottom of the central chamber, and the first auxiliary capillary generator is formed of a porous body and/or a wick structure.

13. The flat evaporator of claim 9, wherein a first auxiliary capillary generator is formed at the bottom of the central chamber, and the first auxiliary capillary generator is formed of a porous body and/or a wick structure.

14. The flat evaporator of claim 5, wherein a second auxiliary capillary generator is formed at the bottom of the manifold region, and the second auxiliary capillary generator is formed of a porous body and/or a wick structure.

15. The flat evaporator of claim 8, wherein a second auxiliary capillary generator is formed at the bottom of the manifold region, and the second auxiliary capillary generator is formed of a porous body and/or a wick structure.

16. The flat evaporator of claim 9, wherein a second auxiliary capillary generator is formed at the bottom of the manifold region, and the second auxiliary capillary generator is formed of a porous body and/or a wick structure.

17. The flat evaporator of claim 5, wherein the gas collector is formed in the top plate and has a conical structure which tapers in an upward direction.

18. The flat evaporator of claim 17, wherein the gas collector comprises at least one stepped edge on the inner wall of the conical structure.

19. The flat evaporator of claim 5, wherein the capillary region asymmetrically surrounds the vaporization cavity region, and the width of the capillary region is larger towards the coolant supply portion.

20. The flat evaporator of claim 5, wherein the width of the manifold region surrounding the capillary region is larger farther away from the coolant supply portion.

21. The flat evaporator of claim 19, wherein the width of the manifold region surrounding the capillary region is larger farther away from the coolant supply portion.

22. The flat evaporator of claim 5, wherein the manifold region is provided with a plurality of coolant supply portions so that the liquid coolant is supplied through multiple paths into the manifold region.

23. The flat evaporator of claim 22, wherein two coolant supply portions are symmetrically disposed at opposite sides of the center chamber.

24. The flat evaporator of claim 5, wherein two coolant supply portions are symmetrically disposed at opposite sides of the center chamber so that the liquid coolant is supplied through the two coolant supply portions into the manifold region.

25. The flat evaporator of claim 6, wherein a coolant inlet passage extends from one side of the substrate or the top late to the manifold region, and a coolant output passage extends from one side of the top late to the gas collector.

26. The flat evaporator of claim 7, wherein a coolant inlet passage extends from one side of the substrate or the top late to the manifold region, and a coolant output passage extends from one side of the top late to the gas collector.

27. The flat evaporator of claim 6, wherein a groove is formed at the bottom of the top plate corresponding to only the manifold region or both of the manifold region and the capillary region, thereby increasing the entire volume of the manifold region.

28. The flat evaporator of claim 7, wherein a groove is formed at the bottom of the top plate corresponding to only the manifold region or both of the manifold region and the capillary region, thereby increasing the entire volume of the manifold region.

29. The flat evaporator of claim 6, wherein a first auxiliary capillary generator is formed at the bottom of the central chamber, and the first auxiliary capillary generator is formed of a porous body and/or a wick structure.

30. The flat evaporator of claim 7, wherein a first auxiliary capillary generator is formed at the bottom of the central chamber, and the first auxiliary capillary generator is formed of a porous body and/or a wick structure.

31. The flat evaporator of claim 6, wherein a second auxiliary capillary generator is formed at the bottom of the manifold region, and the second auxiliary capillary generator is formed of a porous body and/or a wick structure.

32. The flat evaporator of claim 7, wherein a second auxiliary capillary generator is formed at the bottom of the manifold region, and the second auxiliary capillary generator is formed of a porous body and/or a wick structure.

33. The flat evaporator of claim 12, wherein a second auxiliary capillary generator is formed at the bottom of the manifold region, and the second auxiliary capillary generator is formed of a porous body and/or a wick structure.

34. The flat evaporator of claim 13, wherein a second auxiliary capillary generator is formed at the bottom of the manifold region, and the second auxiliary capillary generator is formed of a porous body and/or a wick structure.

35. The flat evaporator of claim 6, wherein the gas collector is formed in the top plate and has a conical structure which tapers in an upward direction.

36. The flat evaporator of claim 7, wherein the gas collector is formed in the top plate and has a conical structure which tapers in an upward direction.

37. The flat evaporator of claim 6, wherein the capillary region asymmetrically surrounds the vaporization cavity region, and the width of the capillary region is larger towards the coolant supply portion.

38. The flat evaporator of claim 5, wherein the capillary region asymmetrically surrounds the vaporization cavity region, and the width of the capillary region is larger towards the coolant supply portion.

39. The flat evaporator of claim 6, wherein the width of the manifold region surrounding the capillary region is larger farther away from the coolant supply portion.

40. The flat evaporator of claim 7, wherein the width of the manifold region surrounding the capillary region is larger farther away from the coolant supply portion.

41. The flat evaporator of claim 6, wherein the manifold region is provided with a plurality of coolant supply portions so that the liquid coolant is supplied through multiple paths into the manifold region.

42. The flat evaporator of claim 7, wherein the manifold region is provided with a plurality of coolant supply portions so that the liquid coolant is supplied through multiple paths into the manifold region.

43. The flat evaporator of claim 6, wherein two coolant supply portions are symmetrically disposed at opposite sides of the center chamber so that the liquid coolant is supplied through the two coolant supply portions into the manifold region.

44. The flat evaporator of claim 7, wherein two coolant supply portions are symmetrically disposed at opposite sides of the center chamber so that the liquid coolant is supplied through the two coolant supply portions into the manifold region.

* * * * *